United States Patent [19]

Dent

[11] Patent Number: 5,095,288
[45] Date of Patent: Mar. 10, 1992

[54] PHASE-LOCKED LOOP HAVING A VARIABLE BANDWIDTH

[75] Inventor: Paul W. Dent, Stehag, Sweden

[73] Assignee: Telefonaktiebolaget L M Ericsson, Stockholm, Sweden

[21] Appl. No.: 611,523

[22] Filed: Nov. 13, 1990

[30] Foreign Application Priority Data

Nov. 13, 1989 [SE] Sweden ............................. 8903799

[51] Int. Cl.⁵ .............................................. H03L 7/00
[52] U.S. Cl. ........................................ 331/17; 331/25
[58] Field of Search ................... 331/17, 25; 307/510, 307/511, 514; 328/133, 134, 155

[56] References Cited

U.S. PATENT DOCUMENTS

| | | | |
|---|---|---|---|
| 4,546,330 | 10/1985 | Okada | 331/17 |
| 4,562,411 | 12/1985 | O'Rourke et al. | 331/1 A |
| 4,617,711 | 9/1979 | Smoot | 331/17 |

*Primary Examiner*—Robert J. Pascal
*Attorney, Agent, or Firm*—Burns, Doane, Swecker & Mathis

[57] ABSTRACT

The invention relates to a phase-locked loop having a variable bandwidth and comprising a controlled oscillator, a phase comparison device, two current generating devices (21-22, 25-26) and a loop filter (23-24). Each of the current generating devices is intended to produce a positive or a negative pulsed current in response to signals from the phase comparison device. The outputs of the current generating devices are each connected to a respective point in the loop filter. The loop bandwidth can be varied continuously while maintaining a desired damping factor, by increasing the amplitude of the currents from each of the current generating devices (21-22, 25-26) when the bandwidth is to be increased, and vice versa.

9 Claims, 2 Drawing Sheets

PHASE-LOCKED LOOP HAVING A VARIABLE BANDWIDTH

TECHNICAL FIELD

The invention relates to a phase-locked loop of variable bandwidth comprising a controlled oscillator for generating a signal of variable frequency, a phase comparison device, a filter circuit which includes at least one resistive element and one capacitive element, a controllable first and second current generating device, each of which is constructed to generate a positive or a negative pulsed current in response to output signals from the phase comparison device, and of which the first current-generating device has an output which is connected to a first point in the filter circuit and the second current-generating device has an output which is connected to a second point in the filter circuit, and which loop further includes a control device for controlling the amplitudes of said currents.

PRIOR ART

In the case of a phase-locked loop, the speed at which frequency changes and frequency corrections can be made is dependent on the bandwidth of the loop. In turn, this is dependent, among other things, on the filter included in the loop, the purpose of which filter is to lowpass filter a control voltage formed to control the oscillator frequency. It is necessary to lowpass filter the control voltage in order to avoid voltage ripple and resultant undesirable variations in the frequency of the oscillator output signal. In practice, however, filtering of the control voltage means that the speed at which desired changes in frequency of the oscillator signal can be made is too low for certain applications. The filter may, for instance, consist of a resistor connected in series with a capacitor. The resistor is normally called the damping resistor as its purpose is to damp down the tendency of the loop to overshoot and undershoot in an oscillatory fashion in response to transient changes. While improving the loop stability however, the damping resistor limits the speed at which voltage changes and therewith frequency changes, can be made. One method of enabling the frequency changes to be made quickly, or to enable large phase errors to be quickly corrected, comprises increasing the loop bandwidth when such changes are to be made, and thereafter reducing the bandwidth to a standard bandwidth value.

Increasing the loop bandwidth when rapid changes in frequency are required is a well known technique, but the well-known difficulty with this method is to avoid causing a transient error or "glitch" when the loop bandwidth is switched back to its original value after the loop has settled.

One method of accomplishing glitch-free loop bandwidth changes by utilizing two charge pumps that are controlled alternately is described in US Pat. No. 4,167,711. In this prior art, the loop filter consists of two resistors and one capacitor, which are connected in series. A first charge pump having two current generators has an output which is connected to the capacitor of the filter through two resistors. The output from a second charge pump having two current generators is connected to the filter capacitor through solely one of the resistors. The charge pumps are controlled in a manner such that when desiring a low loop bandwidth, the amplitude of the currents from the second charge pump is equal to zero, i.e. only the first charge pump is then active. When desiring a high loop bandwidth, the circumstance is the reverse, i.e. only the second charge pump is then active.

The loop bandwidth can be varied slightly, by varying the amplitude of the current from the first or the second charge pump. This is explained by the fact that the loop bandwidth is dependent on the current flowing through the filter capacitor. The so-called damping factor of the loop obtains an optimum value for a given low loop bandwidth and a given high loop bandwidth, due to the fact that the damping factor is dependent on the product of the prevailing current strength and also on the resistance of the resistor through which the current flows. Consequently, it is possible to vary the loop bandwidth slightly about a low and a high value respectively, without excessively impairing the damping factor.

DISCLOSURE OF THE INVENTION

The object of the present invention is to provide a phase-locked loop of the kind described in the introduction of which the bandwidth can be varied continuously without impairing the loop stability. This is achieved by increasing the amplitude of the currents from both the first and the second current-generating device when increasing the loop bandwidth. In this way, both of the devices will be active, at least when a higher loop bandwidth is desired when lowest bandwidth used. The amplitudes of the currents from the two current-generating devices are reduced when wishing to decrease the bandwidth. In this way it is possible to control the bandwidth and the damping factor independently of one another, which enables the bandwidth to be varied continuously between a low and a high value while retaining the damping factor.

It can be mentioned that it is advantageous to have separate means to vary the damping factor from the means to vary the loop bandwidth when the loop characteristics are to be varied for reasons other than to achieve rapid frequency changes.

The characteristic features of the invention are set forth in the following claims.

BRIEF DESCRIPTION OF THE DRAWINGS

The invention will now be described in more detail with reference to the accompanying drawings, in which.

BEST MODES OF CARRYING OUT THE INVENTION

Figure 1:
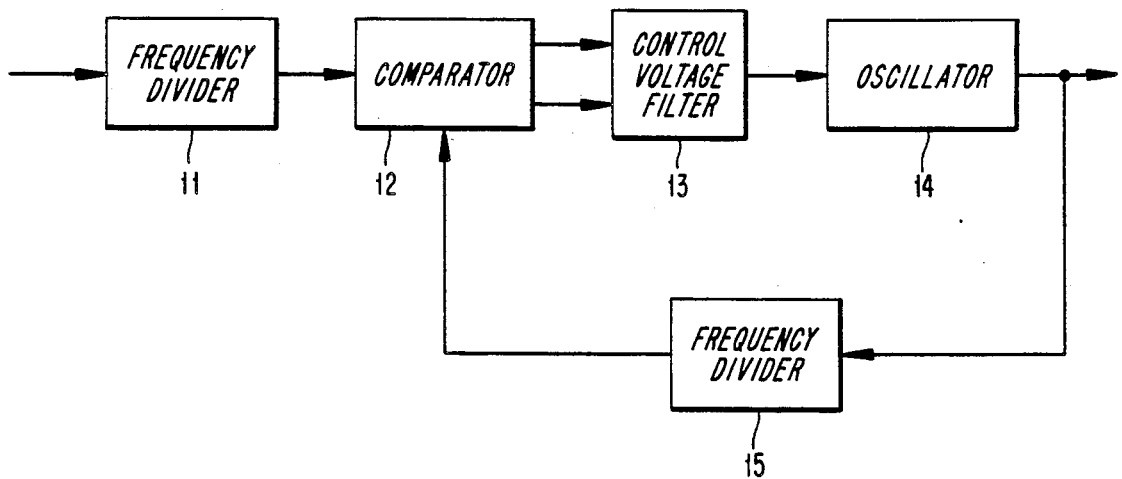
FIG. 1 is a block schematic of a conventional phase-locked loop having a controlled oscillator.

FIG. 1 is an exemplifying block schematic which illustrates a conventional phase-locked loop. The reference numeral 14 identifies a controlled oscillator, for instance a so-called VCO (voltage controlled oscillator). The frequency of the oscillator output signal is divided in a frequency divider 15, and a signal of divided frequency is applied to a phase comparison device 12. A reference signal is applied to a frequency divider 11, which, similar to the frequency divider 15, is connected to the phase comparison device 12. The frequencies of the oscillator signal and the reference signal are divided down in a known manner, in dependence on the desired frequency of the oscillator signal. The phase comparison device 12 produces pulsed signals on two outputs, which are connected to a device 13 which functions to produce a filtered control voltage, which is applied to the oscillator 14.

The two signals applied to the phase comparison device 12 consist of short-pulse trains. When the pulses in the two pulse trains occur simultaneously, short pulses are produced on the two outputs. When the pulses do not occur simultaneously, short pulses are produced on one of said outputs, whereas on the other of said outputs there are produced pulses which have a width proportional to the time difference between the pulses in the one pulse train and the pulses in the other pulse train. When the time difference between the pulses of said one pulse train changes continuously in comparison with the pulses in the other said pulse train, i.e. when the pulse frequencies are mutually different, short pulses are produced on the one output and pulses having a successively increasing pulse width are produced on the other output. When the pulse width has reached a maximum value, there is commenced a new sequence of successively increasing pulse widths of said pulses. Which of the outputs shall produce short pulses and which of said outputs shall produce long pulses is determined by whether the pulses in the pulse train deriving from the reference signal arrive before or after the pulses in the pulse train deriving from the oscillator signal.

Figure 2:
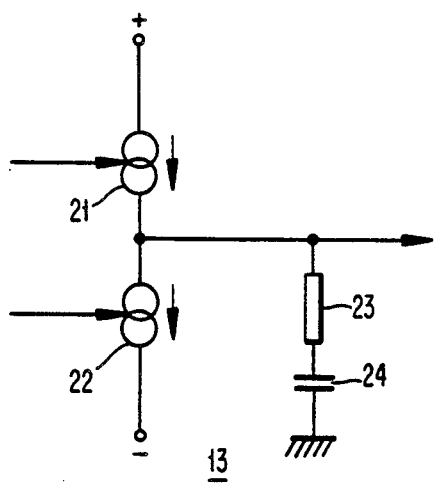
FIG. 2 illustrates in more detail a previously known device included in the loop illustrated in FIG. 1 and functioning to produce a filtered oscillator control voltage.

FIG. 2 illustrates an example of a known technique applied with the device 13, the function of which is to produce a filtered oscillator control voltage. This device comprises two current generators 21, 22 and a filter which consists of a resistor 23 connected in series with a capacitor 24. In practice, however, the device 13 may include more filter circuits than the filter 23, 24. These further circuits can be positioned both to the left and to the right of the illustrated filter.

When the current generator 21 is activated, a positive current is delivered to the filter, and when the current generator 22 is activated, a negative current is delivered to said filter. Consequently, the voltage across the capacitor 24 will increase when the current generator 21 is activated and decrease when the current generator 22 is activated. The phase comparison device 12 in FIG. 1 is intended to function in a manner such that the current generator 21 is activated when the pulses in the pulse train deriving from the reference signal arrive before the pulses in the pulse train deriving from the oscillator signal. This results in an increase in the frequency of the oscillator signal. In other cases, the current generator 22 is activated, so as to decrease the frequency of said oscillator signal.

As a result of the aforedescribed filtering of the oscillator control signal, it is not always possible to carry out frequency changes and phase corrections quickly enough, as mentioned in the aforegoing.

Figure 3:
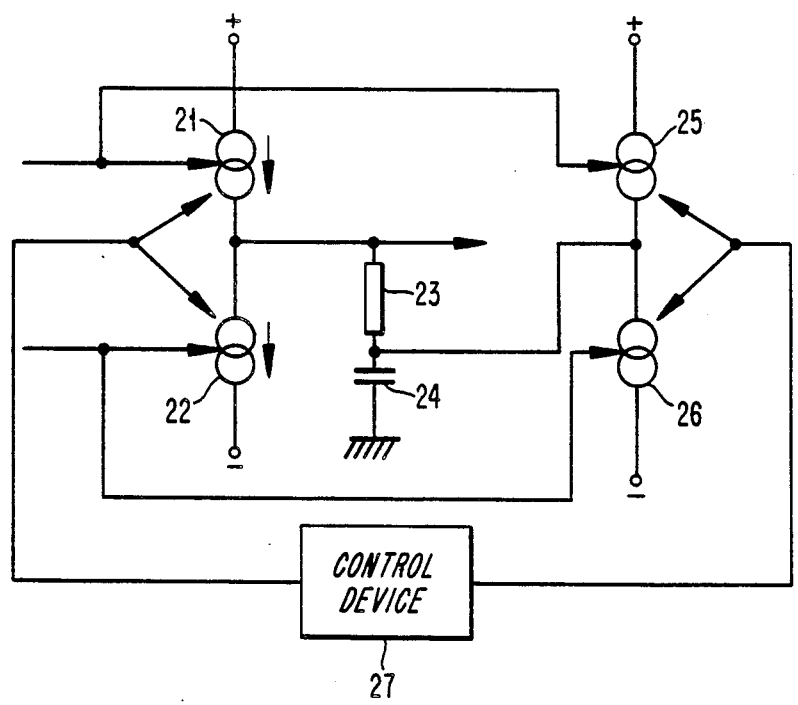
FIGS. 3 and 4 each illustrate two exemplifying embodiments of devices which function to produce a filtered oscillator control voltage and which are arranged to enable the loop bandwidth to be varied in accordance with the invention.

FIG. 3 illustrates a first exemplifying embodiment of a device for producing a filtered control voltage for delivery to the oscillator, this device being constructed in a manner which will enable the loop bandwidth to be varied in accordance with the present invention. The device includes two current generators 21, 22 and a filter 23, 24, which coincide with corresponding units in FIG. 2 but with the difference that the current generators can be controlled so as to enable the amplitude of the currents also to be controlled. The illustrated device also includes a second pair of current generators 25, 26. These generators are connected to the junction point between the resistor 23 and the capacitor 24, i.e. to a point in the filter which is different to the point to which the current generators 21, 22 are connected. The current generators 24, 26 are also controllable, so as to enable the amplitude of the currents to be varied. The amplitudes of the currents from the current generators 21, 22 and 25, 26 are controlled from a control device 27 in pairs, independently of one another, as will be evident from the Figure. It will also be seen from the Figure that the current generator 25 is activated by the same pulse train as the current generator 21. The current generators 22 and 26 are also activated by one and the same pulse train.

Because the second pair of current generators 25 and 26 causes current to flow only through the capacitor and not the resistor, it is possible to determine the amount of current flowing through the capacitor independently from the amount of current flowing through the resistor, and therefore to charge or discharge the capacitor at speeds not limited by the resistor During those time periods in which a low loop bandwidth is desired, it may be suitable to set to zero the amplitude of the currents deriving from the current generators 25, 26 of said second pair, i.e. not to use these current generators. During these time periods, the device illustrated in FIG. 3 will function, in principle, in the same manner as the known device illustrated in FIG. 2. However, because the amplitudes are controllable, it is possible to permit the currents deriving from the current generators 21, 22 to be weaker than is appropriate in the case of the device illustrated in FIG. 2.

With the device illustrated in FIG. 3, it is possible to determine the loop bandwidth and the damping factor independently of one another. It is possible therefore to vary the loop bandwidth while at the same time retaining the damping factor and maintaining loop stability, by varying the current strength of the current generators in a suitable manner. Assume that the currents from the first pair of current generators 21, 22 have a low value I0 in a normal case, and that the currents from the second pair 25, 26 have a zero value. When desiring a high loop bandwidth, for instance during frequency changes, the currents from the first pair of current generators are appropriately changed from the low value I0 to a higher value I1, with the aid of control signals from the control device 27, whereas the currents from the second pair of current generators are changed from zero to a value I2 which is preferably higher than I1. It can be shown that the bandwidth is increased by a factor of N when the current I1 obtains the value N×I0 and the current I2 obtains the value N x (N-1) x I0. The time taken to effect a frequency change is decreased by a factor of N in this way.

The currents are returned to their normal values, with the aid of control signals from the control device 27, when again desiring a low loop bandwidth. In conjunction with a frequency change, this occurs, for instance, when the phase error detected in the phase comparison device 12 lies beneath a given value, or simply when a given time period has lapsed after commencement of the frequency change.

It may be suitable at times to vary the loop bandwidth successively. As mentioned above, the bandwidth and the damping factor are controlled independently of one another, with the aid of the simultaneous currents from the two pairs of current generators. The bandwidth is therewith determined by the combined current through the capacitor and the damping factor is determined by the current through the resistor. The latter is derived solely from the current generators 21, 22.

Figure 4:
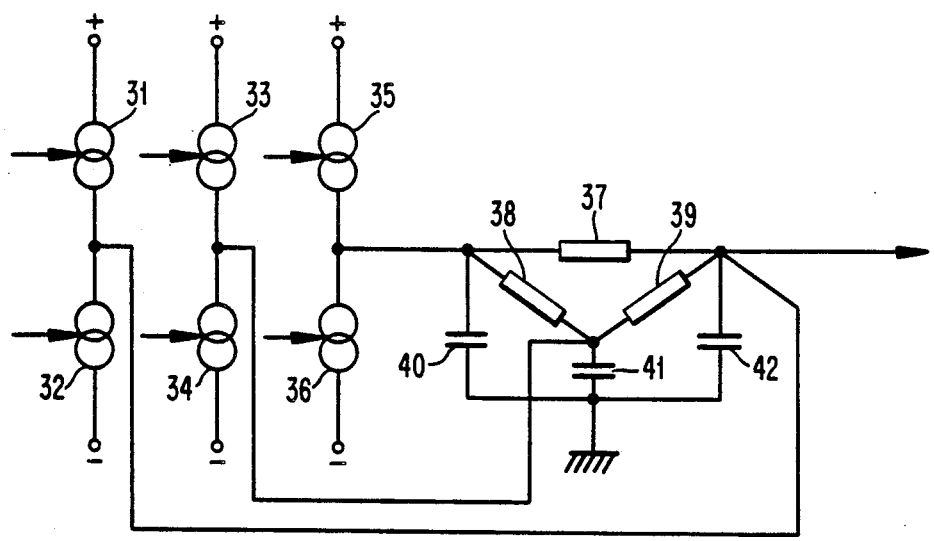

FIG. 4 illustrates a second exemplifying embodiment of the device for producing the filtered control voltage applied to the oscillator and forming part of the inventive apparatus. According to this embodiment, the device comprises three pairs of current generators 31-36 and a more complex filter than that earlier described and illustrated. The filter comprises three resistors 37-39 and three capacitors 40-42. Each of the capacitors has its one terminal connected to earth, and each of the three pairs of current generators is connected to a respective second terminal on the capacitors. The three upper current generators 31, 33, 35 are activated by the same signal, and the three lower current generators 32, 34, 36 are also activated by a single signal, although not shown in the Figure. There is also included in this case a control device which corresponds to the control device 27 of the FIG. 3 embodiment and which functions to control the amplitude of the currents produced by the current generators. This has not been shown in the Figure either.

In a normal case, i.e. when desiring a low loop bandwidth, only the current generators 35, 36 or the current generators 33, 34 are used for instance. When desiring a high bandwidth, two or all three pairs of current generators are used. The current generators 31, 32 in particular provide a rapid voltage change of the control voltage produced by the filter circuit. Other possibilities are conceivable however. The bandwidth can also be varied continuously in this case between a low and a high value with a retained damping factor, in that several pairs of current generators are active at the same time.

It is conceivable to permit the additional current generators, for instance 25 and 26 in FIG. 3, to also generate currents when low loop bandwidths are desired. The amplitude of these currents should therewith be much lower than when high bandwidths are desired.

If the loop bandwidth is to be changed successively, the amplitudes of the different current pulses are changed, for instance in a plurality of stages, with one stage for each current pulse. Each such amplitude change is preferably effected in the interval between two current pulses, thereby enabling undesirable voltage variations in the oscillator control signal to be avoided.

As will be understood, it is also conceivable to replace, in a suitable manner, each of the current generator pairs with a single current generator which can be caused either to supply a positive or a negative current to a determined point with the aid of control signals.

Each current generator may also be replaced with a voltage source having a number of resistors which can be activated in a suitable manner with the aid of control signals.

It is also conceivable to utilize three or more pairs of current generators, without connecting all generator pairs to different points in the filter circuit. At least two of said pairs must always be connected to different points, however.

Furthermore, the phase comparison device can be constructed to produce pulses in a manner different to that described above.

I claim:

1. A phase-locked loop of variable bandwidth comprising:
    a controlled oscillator for generating a signal of variable frequency;
    a phase comparison device;
    a filter circuit, including at least one resistive element and at least one capacitive element, for producing a control signal to control said oscillator;
    first and second controllable current-generating devices, each being constructed to generate a positive or a negative pulsed current in response to output signals from the phase comparison device, said first current-generating device having an output connected to a first point in the filter circuit and said second current-generating device having an output connected to a second point in the filter circuit; and
    a control device for controlling the amplitudes of said currents generated by said current-generating devices said control device being operative to change the amplitudes of the currents from each of the current-generating devices in a first direction to produce a change of the phase-locked loop bandwidth in one direction and to change said amplitudes in another direction to produce a change in the phase-locked loop bandwidth in the other direction, to thereby enable the phase-locked loop bandwidth to be varied continuously while maintaining a desired damping factor.

2. A phase-locked loop according to claim 1, said second point being a connection point between said resistive element and said capacitive element and said first point being a terminal on the resistive element other than said connection point.

3. The phase-locked loop of claim 2, wherein said control device controls the amplitudes of the currents generated by said first and second current-generating devices independently of one another.

4. A phase-locked loop according to claim 3, wherein said control device controls the amplitude of the current from the second current-generating device to be zero when a low phase-locked loop bandwidth is desired.

5. A phase-locked loop of variable bandwidth comprising:
    a controlled oscillator for generating a signal of variable frequency;
    a phase comparison device;
    a filter circuit for producing a control signal to control said oscillator;
    a plurality of controllable current-generating devices, each being constructed to generate a positive or a negative pulsed current in response to output signals from the phase comparison device, each current-generating device having an output connected to a separate point in the filter circuit; and
    a control device for controlling the amplitudes of said currents generated by said current-generating devices said control device being operative to change the amplitudes of the currents from each of the current-generating devices in a first direction to produce a change of the phase-locked loop bandwidth in one direction and to change said amplitudes in another direction to produce a change in the phase-locked loop bandwidth in the other direction, to thereby enable the phase-locked loop bandwidth to be varied continuously while maintaining a desired damping factor.

6. A phase-locked loop of variable bandwidth according to claim 5 wherein said filter circuit includes at least two resistive elements and at least two capacitive elements.

7. A phase-locked loop according to claim 6, said separate points each being a separate connection point between differing ones of said resistive elements and at least one of said capacitive elements.

8. The phase-locked loop of claim 7, wherein said control device controls the amplitudes of the currents generated by each of said current-generating devices independently of one another.

9. A phase-locked loop according to claim 8, wherein said control device controls the amplitude of the current from one of the current-generating devices to be zero when a low phase-locked loop bandwidth is desired.

* * * * *